(12) United States Patent
Oyama

(10) Patent No.: US 8,519,782 B2
(45) Date of Patent: Aug. 27, 2013

(54) CONSTANT VOLTAGE CIRCUIT

(75) Inventor: Manabu Oyama, Kyoto (JP)

(73) Assignee: Rohm Co., Ltd. (JP)

( * ) Notice: Subject to any disclaimer, the term of this patent is extended or adjusted under 35 U.S.C. 154(b) by 189 days.

(21) Appl. No.: 13/070,036

(22) Filed: Mar. 23, 2011

(65) Prior Publication Data

US 2011/0234260 A1 Sep. 29, 2011

(30) Foreign Application Priority Data

Mar. 26, 2010 (JP) .................................. 2010-073217

(51) Int. Cl.
*G05F 1/10* (2006.01)
(52) U.S. Cl.
USPC .......................................... 327/541; 327/540
(58) Field of Classification Search
USPC .......................................... 327/538, 540, 541
See application file for complete search history.

(56) References Cited

U.S. PATENT DOCUMENTS

| | | | | |
|---|---|---|---|---|
| 6,329,871 B2 * | 12/2001 | Taguchi | ......................... | 327/539 |
| 6,791,396 B2 * | 9/2004 | Shor et al. | ...................... | 327/543 |
| 7,843,253 B2 * | 11/2010 | Aota et al. | ..................... | 327/538 |
| 8,174,309 B2 * | 5/2012 | Yoshino et al. | ............... | 327/541 |

FOREIGN PATENT DOCUMENTS

| | | |
|---|---|---|
| JP | 6-67744 A | 3/1994 |
| JP | 7-92203 A | 4/1995 |
| JP | 2002-140124 A | 5/2002 |

* cited by examiner

*Primary Examiner* — Hai L Nguyen
(74) *Attorney, Agent, or Firm* — Cantor Colburn LLP

(57) ABSTRACT

A current source generates a reference current. A first transistor is a depletion-type MOSFET arranged such that one terminal thereof is connected to the current source and its gate is connected to its source. A second transistor is an enhancement-type MOSFET arranged such that one terminal thereof is connected to the other terminal of the first transistor, the other terminal thereof is connected to a fixed voltage terminal, and its gate and drain are connected. A third MOSFET is an enhancement-type P-channel MOSFET arranged such that one terminal thereof is connected to the current source, the other terminal thereof is connected to the fixed voltage terminal, and its gate is connected to a connection node connecting the first and second transistors. A constant voltage circuit outputs at least a voltage that corresponds to the gate voltage of the third transistor or a voltage that corresponds to the gate voltage thereof.

7 Claims, 7 Drawing Sheets

COMPARISON TECHNIQUE

200

US 8,519,782 B2

CONSTANT VOLTAGE CIRCUIT

BACKGROUND OF THE INVENTION

1. Field of the Invention

The present invention relates to a semiconductor integrated circuit employing a MOSFET (Metal Oxide Semiconductor Field Effect Transistor).

2. Description of the Related Art

In a semiconductor integrated circuit, a constant voltage circuit (reference voltage circuit) is employed in order to generate a constant voltage that does not fluctuate with fluctuation in the power supply voltage or fluctuation in the temperature. Patent documents 1 and 2 each disclose a constant voltage circuit employing MOSFETs. FIG. 1 is a circuit diagram which shows a configuration of a constant voltage circuit 200 according to a comparison technique. The constant voltage circuit 200 includes a first transistor M11 and a second transistor M12 sequentially stacked between the power supply terminal and the ground terminal. The first transistor M11 is configured as a depletion-type N-channel MOSFET, and is arranged such that the gate thereof is connected to the source thereof. The second transistor M12 is configured as an enhancement-type N-channel MOSFET, and is arranged such that the gate thereof is connected to the drain thereof. A comparatively stable reference voltage Vref is generated at a connection node N1 that connects the first transistor M11 and the second transistor M12.

RELATED ART DOCUMENTS

[Patent Documents ]
[patent document 1]
  Japanese Patent Application Laid Open No. H06-067744
[patent document 2]
  Japanese Patent Application Laid Open No. 2002-140124
[patent document 3]
  Japanese Patent Application Laid Open No. H07-092203

However, the constant voltage circuit 200 shown in FIG. 1 has a problem in that the reference voltage Vref fluctuates due to fluctuation in the power supply voltage. In other words, such an arrangement has a problem of a low PSRR (power supply rejection ratio).

SUMMARY OF THE INVENTION

The present invention has been made in order to solve such a problem. Accordingly, it is a general purpose of an embodiment of the present invention to provide a constant voltage circuit having a high PSRR.

An embodiment of the present invention relates to a constant voltage circuit. The constant voltage circuit comprises: a current source configured to generate a reference current; a depletion-type first MOSFET (Metal Oxide Semiconductor Field Effect Transistor) arranged such that one terminal thereof is connected to the current source, and the gate thereof is connected to the source thereof; an enhancement-type second MOSFET arranged such that one terminal thereof is connected to the other terminal of the first MOSFET, the other terminal thereof is connected to a fixed voltage terminal, and the gate thereof is connected to the drain thereof; and an enhancement-type P-channel third MOSFET arranged such that one terminal thereof is connected to the current source, the other terminal thereof is connected to the fixed voltage terminal, and the gate thereof is connected to a connection node that connects the first MOSFET and the second MOSFET. The constant voltage circuit outputs at least one of a voltage that corresponds to the gate voltage of the third MOSFET and a voltage that corresponds to the source voltage of the third MOSFET.

Such an embodiment is capable of generating a stable reference voltage independent of fluctuation in the power supply voltage.

Another embodiment of the present invention relates to a comparator configured to make a comparison between a first voltage and a second voltage, and to generate an output voltage which represents the comparison result. The comparator comprises: a differential pair configured to receive, as input signals, the first voltage and the second voltage; a tail current source configured to supply a tail current to the differential pair; a load circuit connected to the differential pair; a source follower comprising a constant current source and an output transistor arranged on a path of the constant current source, and configured such that the turn-on degree of the output transistor changes according to a current that flows through a transistor that is one component of the differential pair; and a constant voltage element arranged between the transistor that is one component of the differential pair and the control terminal of the output transistor.

With such an embodiment, the constant voltage element provides a reduction in the extent of change in the gate voltage of the output transistor. Thus, such an arrangement provides an improved response speed.

Yet another embodiment of the present invention relates to a voltage monitoring circuit configured to compare a voltage to be monitored with a predetermined reference voltage. The voltage monitoring circuit comprises: the aforementioned constant voltage circuit configured to generate the reference voltage; and the aforementioned comparator configured to compare the voltage to be monitored with the reference voltage.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

[First Embodiment]

Figure 2A:
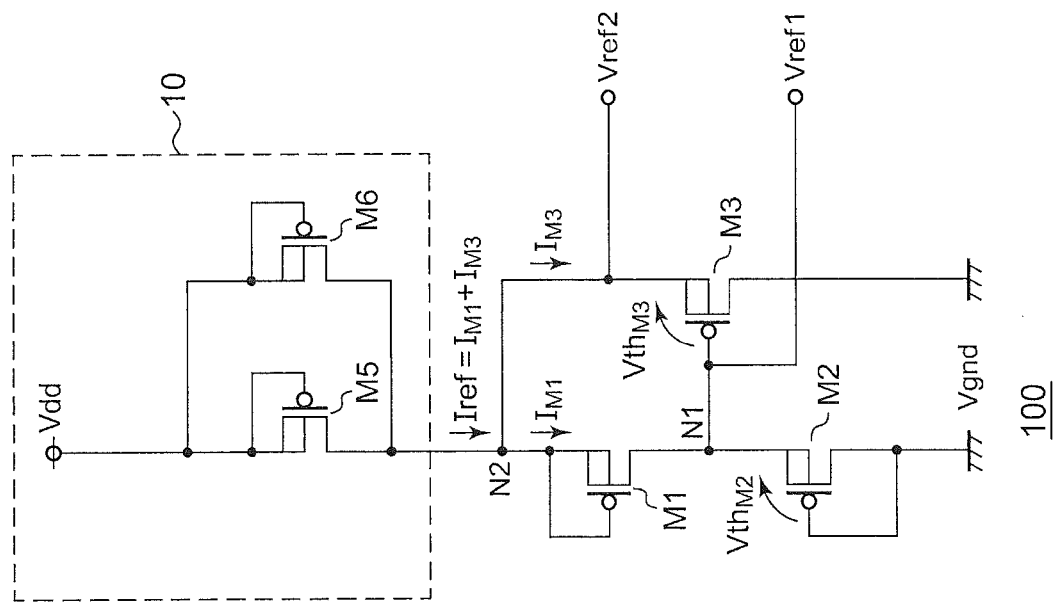
FIGS. 2A and 2B are circuit diagrams each showing a configuration of a constant voltage circuit according to a first embodiment.
Figure 2B:
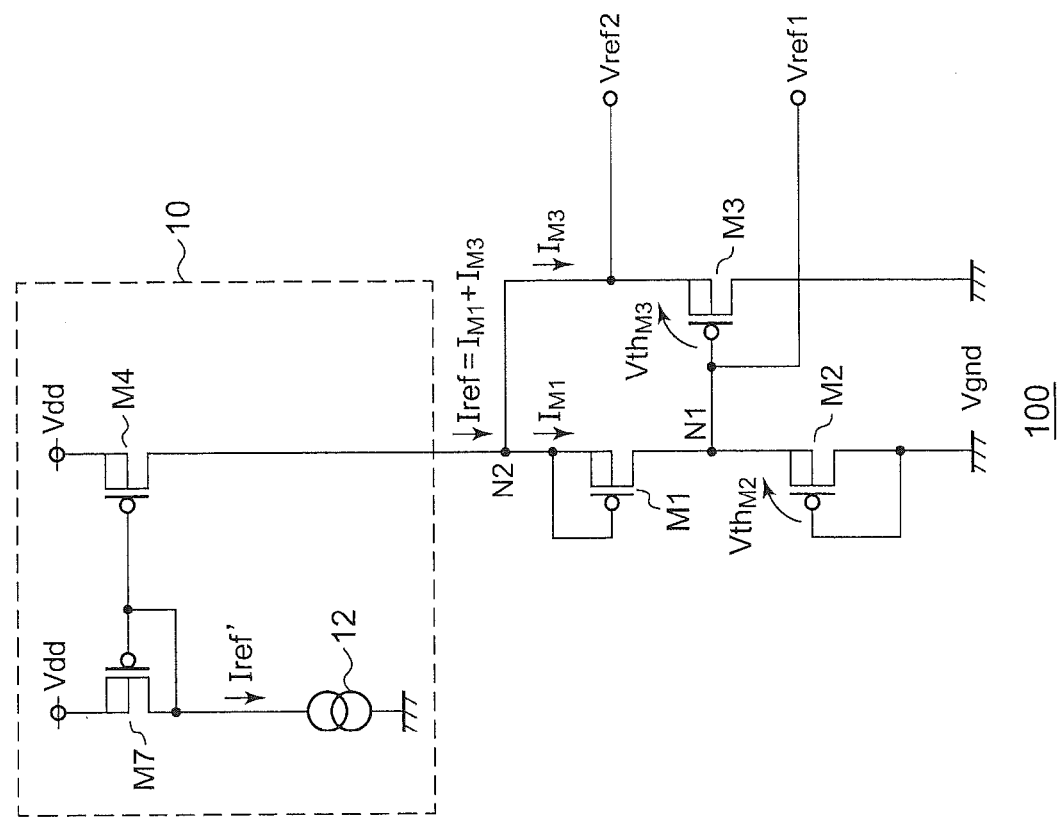

FIGS. 2A and 2B are circuit diagrams each showing a configuration of a constant voltage circuit 100 according to a first embodiment. The constant voltage circuit 100 includes a current source 10, a first transistor M1, a second transistor M2, and a third transistor M3.

The current source 10 generates a reference current Iref. The only difference between FIG. 2A and FIG. 2B is in the configuration of the current source 10. The configuration of the current source 10 will be described later.

The first transistor M1 is configured as a depletion-type P-channel MOSFET (Metal Oxide Semiconductor Field Effect Transistor), and is arranged such that one terminal (source) thereof is connected to the current source 10 and the gate thereof is connected to the source thereof.

The second transistor M2 is configured as an enhancement-type P-channel MOSFET, and is arranged such that one terminal (source) is connected to the other terminal (drain) of the first transistor M1, and the other terminal (drain) thereof is connected to a fixed voltage terminal (ground terminal). Furthermore, the second transistor M2 is arranged such that the gate thereof is connected to the drain thereof.

The third transistor M3 is configured as an enhancement-type P-channel MOSFET, and is arranged such that one terminal (source) thereof is connected to the current source 10, and the other terminal (drain) thereof is connected to the fixed voltage terminal (ground terminal). The gate of the third transistor M3 is connected to a connection node N1 that connects the first transistor M1 and the second transistor M2.

The constant voltage circuit 100 outputs, as the reference voltage Vref, at least one of the voltages that occurs at a node N1 and a node N2.

(1) Voltage Vref1 that occurs at the gate of the third transistor M3 (connection node that connects the first transistor M1 and the second transistor M2).

(2) Voltage Vref2 that occurs at the source N2 of the third transistor M3 (connection node that connects the first transistor M1 and the current source 10).

The above is the basic configuration of the constant voltage circuit 100.

Next, description will be made regarding the current source 10.

The current source 10 shown in FIG. 2A includes a fourth transistor M4, a seventh transistor M7, and a constant current source 12. The fourth transistor M4 and the seventh transistor M7 are each configured as a P-channel MOSFET, and form a current mirror circuit. The fourth transistor M4 duplicates the reference current Iref' generated by the constant current source 12, thereby generating the reference current Iref.

The current source 10 shown in FIG. 2B includes a fifth transistor M5 and a sixth transistor M6. The fifth transistor M5 is configured as a depletion-type P-channel MOSFET, which is the same conduction type as that of the first transistor M1. The sixth transistor M6 is configured as a depletion-type P-channel MOSFET, which is the same conduction type as that of the third transistor M3. The gates and the sources of the fifth transistor M5 and the sixth transistor M6 are each connected to the power supply terminal (Vdd).

The drains of the fifth transistor M5 and the sixth transistor M6 are connected together so as to form a common drain terminal, and the reference current Iref is output via this common drain terminal. A part of the reference current Iref, i.e., $I_{M1}$, flows through the first transistor M1, and the remainder, i.e., $I_{M3}$, flows through the third transistor M3. The transistor size (gate width W/gate length L) of the fifth transistor M5 is adjusted by design so as to provide the flow of the current $I_{M1}$. The transistor size of the sixth transistor M6 is adjusted by design so as to provide the flow of the current $I_{M3}$.

The current source 10 shown in FIG. 2B has a simple configuration, and has an advantage of requiring a small number of circuit elements. It should be noted that the configuration of the current source 10 is not restricted to such arrangements shown in FIGS. 2A and 2B.

The above is the configuration of the constant voltage circuit 100. Next, description will be made regarding the operation thereof.

The current $I_{M1}$, which is a part of the reference current Iref, flows through a path including the first transistor M1 and the second transistor M2. As a result, the electric potential Vref1 at the connection node N1 is stabilized to Vref= $Vth_{M2}$ ... (1).

Here, $Vth_{M2}$ represents the gate-source threshold voltage of the second transistor M2.

Furthermore, the current $I_{M3}$, which is a part of the reference current Iref, flows through the third transistor M3. Thus, the electric potential Vref2 at the connection node N2 is stabilized to Vref2=Vref1+$Vth_{M3}$=$Vth_{M2}$+$Vth_{M3}$ ... (2). Here, $Vth_{M3}$ represents the gate-source threshold voltage of the third transistor M3.

With the constant voltage circuits 100 shown in FIGS. 2A and 2B, by maintaining the reference current Iref1 at a constant value, such an arrangement is capable of stably maintaining the reference voltages Vref1 and Vref2, respectively represented by Expressions (1) and (2).

Figure 1:
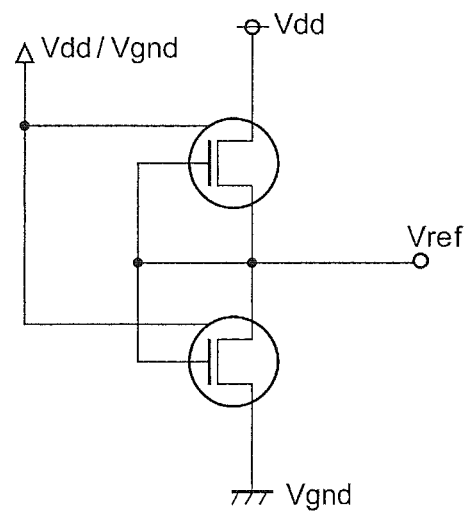
FIG. 1 is a circuit diagram which shows a configuration of a constant voltage circuit according to a comparison technique.

The advantages of the constant voltage circuits 100 shown in FIGS. 2A and 2B can be clearly understood in comparison with the constant voltage circuit 200 shown in FIG. 1. With the constant voltage circuit 200 shown in FIG. 1, if the power supply voltage Vdd fluctuates, the drain voltage of the first transistor M11 also fluctuates. Accordingly, the operating points of the first transistor M1 and the second transistor M2 each fluctuate according to the fluctuation in the power supply voltage Vdd. As a result, the reference voltage Vref fluctuates due to the effects of the power supply voltage Vdd.

In contrast, with the constant voltage circuits 100 shown in FIGS. 2A and 2B, the third transistor M3 functions as a clamping element configured to stabilize the electric potential at the second node N2, i.e., the source voltage of the first transistor M1. Thus, even if the power supply voltage Vdd fluctuates, the operating points of the first transistor M1 and the second transistor M2 do not fluctuate. Thus, such an arrangement is capable of preventing the reference voltages Vref2 and Vref1 from fluctuating. That is to say, the constant voltage circuit 100 provides a higher PSRR than that of the constant voltage circuit 200 shown in FIG. 1.

It should be noted that the transistor size of the third transistor M3 is preferably designed to be greater than the sizes of the first transistor M1 and the second transistor M2. Due to the large transistor size of the third transistor M3, the drain-source voltage VdsM3 of the third transistor M3 becomes smaller. As a result, even in a state in which the power supply voltage Vdd is low, such an arrangement ensures that the source voltage of the first transistor M1 is a sufficiently high voltage.

Conversely, in a case in which a sufficiently large voltage can be employed as the power supply voltage Vdd, the transistor size of the third transistor M3, i.e., the gate-source threshold voltage $Vth_{M3}$ of the third transistor M3, should be designed giving consideration to the value of the desired reference voltage Vref2.

Furthermore, the constant voltage circuit 100 has a configuration in which all the transistors are configured as P-channel MOSFETs. With a circuit in which P-channel MOSFETs and N-channel MOSFETs are mixed, because of process irregularities, there are irregularities from differences in the characteristics of the P-channel MOSFETs and the N-channel MOSFETs. This leads to a problem of irregularities in the operating point of the circuit. In contrast, the constant voltage circuits 100 shown in FIGS. 2A and 2B each have an advantage of a stable operating point of the circuit that is resistant to process irregularities.

Furthermore, by configuring the pair composed of the fifth transistor M5 and the first transistor M1 as the same conduction-type transistors, and by configuring the pair composed of the sixth transistor M6 and the third transistor M3 as the same conduction-type transistors, such an arrangement provides further improvement to the stability of the reference voltages Vref1 and Vref2 with respect to the effects of fluctuation in the power supply voltage and fluctuation in the temperature.

Figures 3A, 3B, 3C:
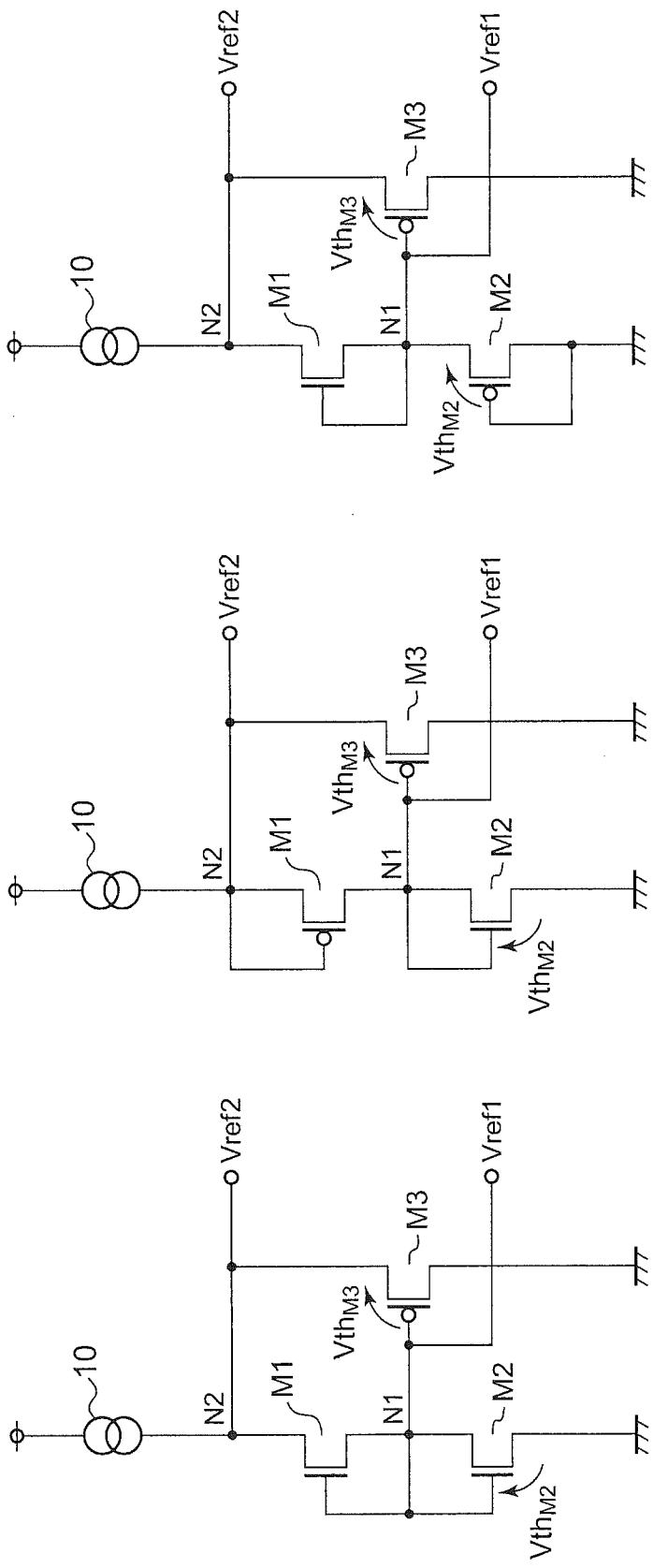
FIGS. 3A through 3C are circuit diagrams each showing a modification of the constant voltage circuit.

FIGS. 3A through 3C are circuit diagrams each showing a modification of the constant voltage circuit 100. The constant voltage circuit 100a shown in FIG. 3A has the same configuration as that of the constant voltage circuit 100 shown in FIG. 2, except that the first transistor M1 and the second transistor M2 are each configured as an N-channel MOSFET.

The constant voltage circuit 100b shown in FIG. 3B has the same configuration as that of the constant voltage circuit 100 shown in FIG. 2, except that the second transistor M2 is configured as an N-channel MOSFET.

The constant voltage circuit 100c shown in FIG. 3C has the same configuration as that of the constant voltage circuits 100 shown in FIGS. 2A and 2B, except that the first transistor M1 is configured as an N-channel MOSFET.

The constant voltage circuits 100a through 100c shown in FIGS. 3A through 3C are each capable of generating the stable reference voltages Vref1 and Vref2 which are resistant to the effects of irregularities in the power supply voltage Vdd and irregularities in the temperature, in the same way as with the constant voltage circuits 100 shown in FIGS. 2A and 2B. The constant voltage circuits 100a through 100c shown in FIGS. 3A through 3C each have a configuration including a mixture of P-channel MOSFETs and N-channel MOSFETS. Accordingly, such arrangements are effectively employed in a case in which a semiconductor process having small process irregularities can be employed.

[Second Embodiment]

Next, description will be made regarding a comparator according to a second embodiment.

In a semiconductor integrated circuit, a comparator is used in order to compare the magnitudes of two voltages.

Figure 4:
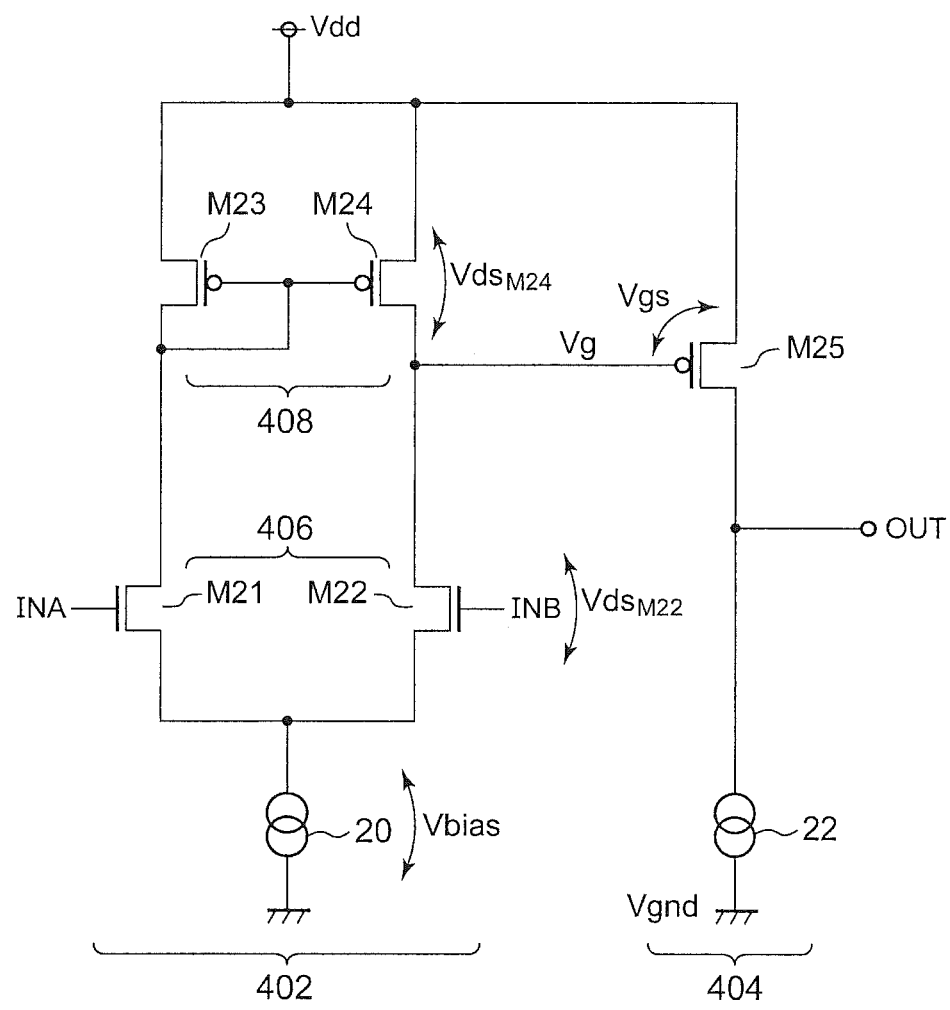
FIG. 4 is a circuit diagram which shows a configuration of a comparator according to a comparison technique.

FIG. 4 is a circuit diagram which shows a configuration of a comparator 400 according to a comparison technique. The comparator 400 includes a differential amplifier 402 and a source follower 404. The differential amplifier 402 includes a differential pair 406 (M21, M22), a current mirror load 408 (M23, M24), and a tail current source 20.

The source follower 404 includes a constant current source 22 and an output transistor M25. The drain voltage of the transistor M22 is input to the gate of the output transistor M25.

The comparator 400 shown in FIG. 4 has a problem in that the response speed is reduced due to the gate capacitance of the output transistor M25. That is to say, the gate voltage Vg of the output transistor M25 is controlled according to the magnitude relation between two input voltages INA and INB. In FIG. 4, the maximum value of the gate voltage Vg is the difference between the power supply voltage Vdd and the drain-source voltage $Vds_{M24}$ of the transistor M24 (Vdd−$Vds_{M24}$). The minimum value of the gate voltage Vg is the sum of the voltage Vbias that occurs between both terminals of the tail current source 20 and the drain-source voltage $Vds_{N22}$ of the transistor M22, i.e., (Vbias+$Vds_{M22}$).

Accordingly, with the comparator 400 shown in FIG. 4, there is a need to change the gate voltage Vg of the output transistor M25 in a range between (Vbias+$Vds_{M22}$) and (Vdd−$Vds_{M24}$). With a larger gate capacitance of the output transistor M25, the period of time required to switch the gate voltage Vg between (Vbias+$Vds_{M22}$) and (Vdd−$Vds_{M24}$) becomes longer. This leads to poor responsiveness of the comparator 400.

A second embodiment is made in view of such a situation. Accordingly, it is an exemplary purpose thereof to provide a comparator having an improved response speed.

Figure 5:
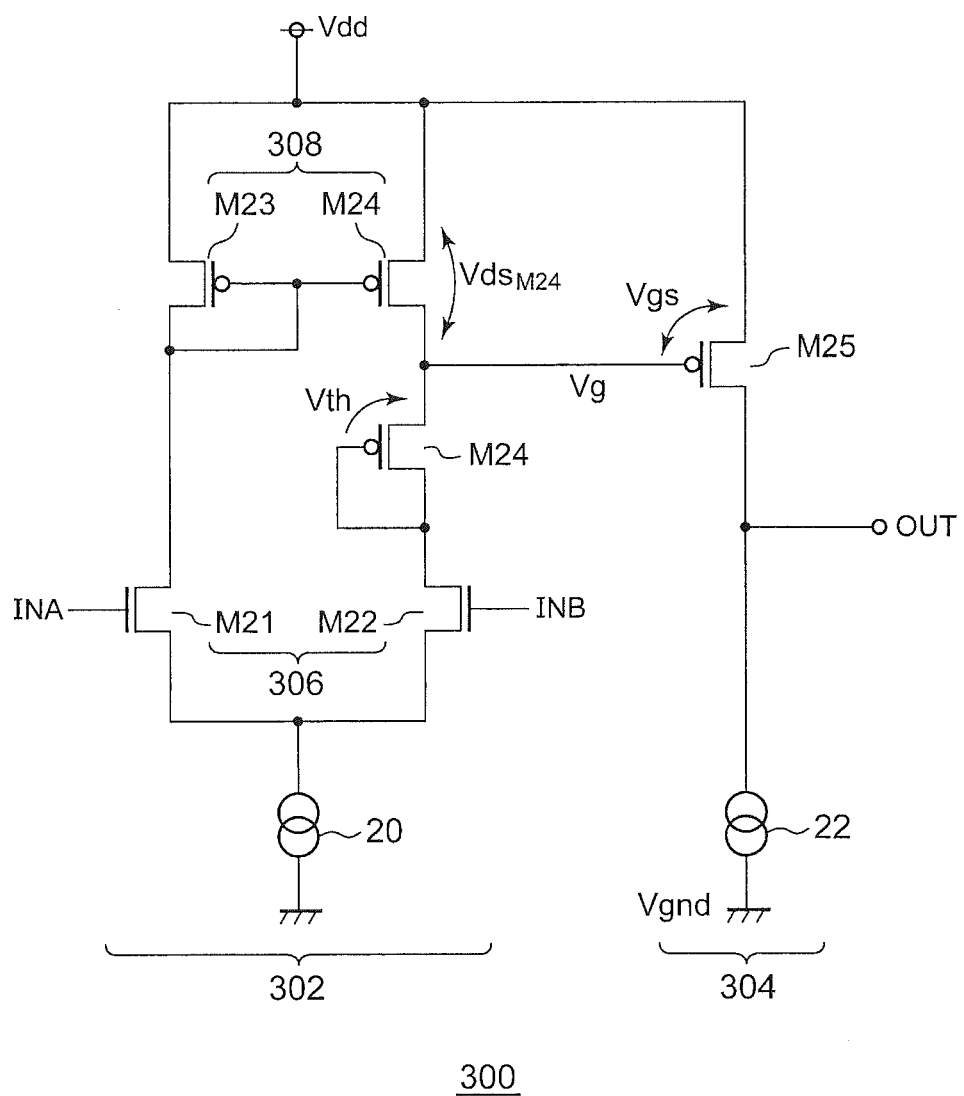
FIG. 5 is a circuit diagram which shows a configuration of a comparator according to a second embodiment.

FIG. 5 is a circuit diagram which shows a configuration of a comparator 300 according to the second embodiment. The comparator 300 is configured to make a comparison between a first voltage INA and a second voltage INB, and to generate an output voltage OUT which represents the comparison result.

The comparator 300 includes a differential amplifier 302 and a source follower 304. The differential amplifier 302 includes a differential pair 306 (M21, M22) respectively configured to receive the first voltage INA and the second voltage INB as input signals, a tail current source 20 configured to supply a tail current to the differential pair 306, a load circuit 308 connected to the differential pair 306, and a constant voltage element 24. The load circuit 308 is configured as a current mirror circuit including transistors M23 and M24.

The source follower 304 includes a constant current source 22 and an output transistor M25 arranged on a path of the constant current source 22. The gate of the output transistor M25 is connected to the drain of the transistor M24, which is one component of the load circuit 308. The turn-on degree of the output transistor M25 changes according to the current that flows through the transistor M22, which is one component of the differential pair 306.

As can be understood in comparison with the comparator 400 shown in FIG. 4, the comparator 300 shown in FIG. 5 includes the constant voltage element 24. The constant voltage element 24 is arranged between the drain of the transistor M22, which is one component of the differential pair 306, and the control terminal (gate) of the output transistor M25.ds In FIG. 4, the constant voltage element 24 is configured as a P-channel MOSFET arranged such that the gate thereof is connected to the drain thereof. The voltage that occurs between both terminals of the constant voltage element 24 is clamped to be equal to or greater than the gate-source threshold voltage of the MOSFET. As the constant voltage element 24, a diode may be employed instead of such a P-channel MOSFET. Also, other kinds of constant voltage elements may be employed. Also, the constant voltage element 24 may include a MOSFET and a diode connected in series.

Figure 6:
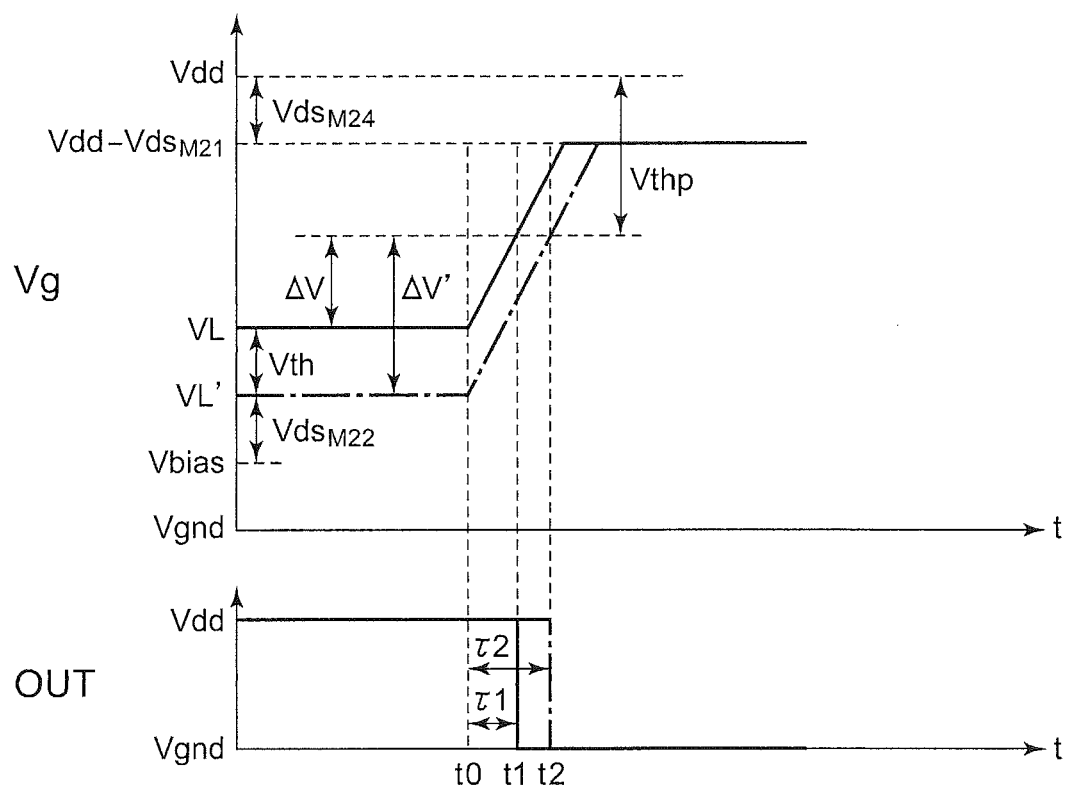
FIG. 6 is a time chart which shows the operation of the comparator shown in FIG. 5.

The above is the configuration of the comparator 300. Next, description will be made regarding the operation thereof. FIG. 6 is a time chart which shows the operation of the comparator 300 shown in FIG. 5. FIG. 6 also shows the operation of the comparator 400 shown in FIG. 4, which is indicated by the lines of dashes and dots. The upper graph in the time chart shows the gate voltage Vg of the output transistor M25, and the lower graph shows the output voltage OUT.

In order to clarify the advantage of the comparator 300 according to the embodiment, first, description will be made regarding the operation of the comparator 400 indicated by the lines of dashes and dots shown in FIG. 4.

In the initial state (t<t0), the relation INA<INB is taken to hold true. In this state, current flows through the transistor M22 side, and accordingly, the gate-source voltage Vgs of the output transistor M25 is set to its lower limit level VL', which is approximately equal to Vbias+$Vds_{M22}$. The gate-source voltage Vgs of the output transistor M25 is greater than its threshold voltage Vthp. Accordingly, in this state, the output transistor M25 is on, and the output voltage OUT is set to high level (Vdd).

When INA becomes greater than INB at the time point t0, current flows through the transistor M21 side, and accordingly, the current that flows through the transistor M22 side is reduced. In this state, the gate voltage Vg rises over time. When the gate-source voltage Vgs of the output transistor M25 becomes smaller than the threshold voltage Vthp at the time point t2, the output transistor M25 is turned off, whereupon the output voltage OUT transits to the low level (Vgnd).

That is to say, with the comparator 400 shown in FIG. 4, the level of the output voltage OUT transits after a delay time τ2 elapses after the relation between the input voltages INA and INB changes.

Next, description will be made regarding the operation of the comparator 300 shown in FIG. 5 with reference to the solid lines.

In the initial state, the relation INA<INB is taken to hold true. In this state, current flows through the transistor M22 side, and accordingly, the gate-source voltage Vgs of the output transistor M25 is set to its lower limit level VL, which is approximately equal to Vbias+$Vds_{M22}$+Vth. That is to say, in the state in which INA<INB, the gate voltage Vg of the output transistor M25 is maintained at a level that is higher than that of the comparator 400 shown in FIG. 4 by the voltage Vth that occurs between both terminals of the constant voltage element 24.

When the relation between INA and INB changes to INA>INB at the time point to, the gate voltage Vg of the output transistor M25 starts to rise. After the delay time τ1 elapses, at the time point t1, the gate-source voltage Vgs of the output transistor M25 becomes smaller than the threshold voltage Vthp, and accordingly, the output transistor M25 is turned off. As a result, the output voltage OUT transits from high level to low level.

With the comparator 400 shown in FIG. 4, in order to switch the transistor M25 from the off state to the on state, there is a need to change the gate voltage Vg by an amount of change ΔVg'. In contrast, with the comparator 300 shown in FIG. 5, the amount of change ΔVg in the gate voltage Vg required to switch the transistor is smaller than that required by the comparator 400 shown in FIG. 4. As a result, such an arrangement provides a reduction in the delay time before the output voltage OUT switches after the magnitude relation between the input voltages INA and INB changes. Thus, such an arrangement provides a comparator 300 having an improved response speed.

It should be noted that description has been made in the embodiment regarding an arrangement in which the differential pair 306 comprises N-channel MOSFETs. Also, the present invention may be applied to a comparator including a differential pair 306 comprising P-channel MOSFETs.

Lastly, description will be made regarding a suitable application of the constant voltage circuit 100 according to the first embodiment and the comparator 300 according to the second embodiment.

Figure 7:
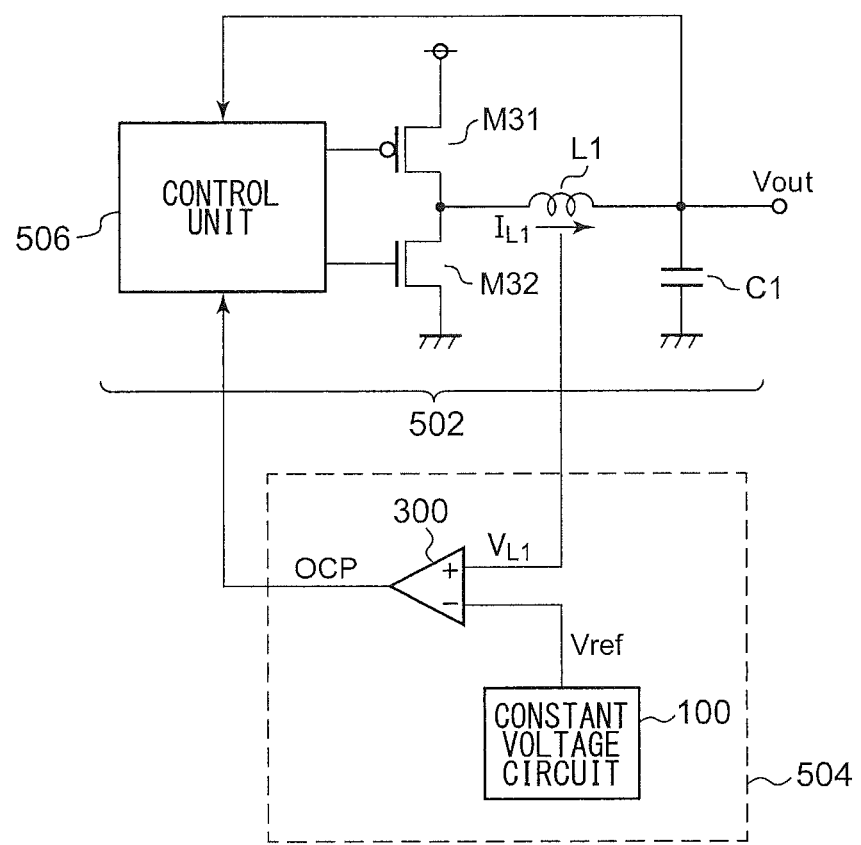
FIG. 7 is a circuit diagram which shows a configuration of a power supply circuit including a constant voltage circuit and a comparator.

FIG. 7 is a circuit diagram which shows a configuration of a power supply circuit 500 including the constant voltage circuit 100 and the comparator 300. The power supply circuit 500 includes a switching regulator. The power supply circuit 500 includes a switching regulator 502 and a overcurrent protection circuit (OCP) 504. The switching regulator 502 includes a control unit 506, transistors M31 and M32, an inductor L1, and a capacitor C1. The switching regulator 502 has a typical configuration, and accordingly, description thereof will be omitted. The control unit 506 controls the duty ratio of the switching operation of the transistors M31 and M32 by means of pulse width modulation or pulse frequency modulation such that the output voltage Vout is maintained at a constant level.

The overcurrent protection circuit 504 is configured as a voltage monitoring circuit configured to compare a voltage $V_{L1}$ that corresponds to a current $I_{L1}$ that flows through the inductor L1 with a predetermined threshold voltage Vref, and to generate a signal OCP which indicates whether or not an overcurrent state occurs. When the signal OCP indicates an overcurrent state, the control unit 506 stops the switching of the transistor M31 and M32. The overcurrent protection circuit 504 includes the constant voltage circuit 100 according to the first embodiment and the comparator 300 according to the second embodiment.

With such a configuration, the constant voltage circuit 100 is capable of generating a stable reference voltage Vref. Thus, such an arrangement provides accurate overcurrent protection. Furthermore, such an arrangement employs a comparator 300 having a high response speed, thereby providing a rapid overcurrent protection operation.

While the preferred embodiments of the present invention have been described using specific terms, such description is for illustrative purposes only, and it is to be understood that changes and variations may be made without departing from the spirit or scope of the appended claims.

What is claimed is:

1. A constant voltage circuit comprising:
   a current source configured to generate a reference current;
   a depletion-type first MOSFET (Metal Oxide Semiconductor Field Effect Transistor) arranged such that one terminal thereof is connected to the current source, and the gate thereof is connected to the source thereof;
   an enhancement-type second MOSFET arranged such that one terminal thereof is connected to the other terminal of the first MOSFET, the other terminal thereof is connected to a first fixed voltage terminal such that a voltage potential at the other terminal of the second MOSFET is fixed, and the gate thereof is connected to the drain thereof; and
   an enhancement-type P-channel third MOSFET arranged such that one terminal thereof is connected to the current source, the other terminal thereof is connected to the first fixed voltage terminal, and the gate thereof is connected to a connection node that connects the first MOSFET and the second MOSFET, wherein the constant voltage circuit outputs at least one of a voltage that corresponds to the gate voltage of the third MOSFET and a voltage that corresponds to the source voltage of the third MOSFET.

2. The constant voltage circuit according to claim 1, wherein the first MOSFET and the second MOSFET are each configured as a P-channel MOSFET.

3. The constant voltage circuit according to claim 1, wherein the first MOSFET and the second MOSFET are each configured as an N-channel MOSFET.

4. The constant voltage circuit according to claim 1, wherein the first MOSFET is configured as a P-channel MOSFET, and the second MOSFET is configured as an N-channel MOSFET.

5. The constant voltage circuit according to claim 1, wherein the first MOSFET is configured as an N-channel MOSFET, and the second MOSFET is configured as a P-channel MOSFET.

6. The constant voltage circuit according to claim 1, wherein the current source comprises:
- a fifth MOSFET configured as a MOSFET of the same conduction type as that of the first MOSFET, and arranged such that the gate and the source thereof are connected to a second fixed voltage terminal; and
- a sixth MOSFET configured as a MOSFET of the same conduction type as that of the third MOSFET, and arranged such that the gate and the source thereof are connected to the second fixed voltage terminal,
- and wherein the current source outputs the reference current via a common drain formed by connecting the drain of the fifth MOSFET and the drain of the sixth MOSFET.

7. A voltage monitoring circuit configured to compare a voltage to be monitored with a predetermined reference voltage, the voltage monitoring circuit comprising:
- a constant voltage circuit configured to generate the reference voltage; and
- a comparator configured to compare the voltage to be monitored with the reference voltage, wherein the constant voltage circuit comprises:
- a current source configured to generate a reference current;
- a depletion-type first MOSFET (Metal Oxide Semiconductor Field Effect Transistor) arranged such that one terminal thereof is connected to the current source, and the gate thereof is connected to the source thereof;
- an enhancement-type second MOSFET arranged such that one terminal thereof is connected to the other terminal of the first MOSFET, the other terminal thereof is connected to a first fixed voltage terminal such that a voltage potential at the other terminal of the second MOSFET is fixed, and the gate thereof is connected to the drain thereof; and
- an enhancement-type P-channel third MOSFET arranged such that one terminal thereof is connected to the current source, the other terminal thereof is connected to the first fixed voltage terminal, and the gate thereof is connected to a connection node that connects the first MOSFET and the second MOSFET, wherein the constant voltage circuit outputs at least one of a voltage that corresponds to the gate voltage of the third MOSFET and a voltage that corresponds to the source voltage of the third MOSFET.

* * * * *